(12) United States Patent
Celaya et al.

(10) Patent No.: US 6,889,429 B2
(45) Date of Patent: May 10, 2005

(54) METHOD OF MAKING A LEAD-FREE INTEGRATED CIRCUIT PACKAGE

(75) Inventors: Phillip C. Celaya, Gilbert, AZ (US); James S. Donley, Gilbert, AZ (US); Stephen C. St. Germain, Scottsdale, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 324 days.

(21) Appl. No.: 09/817,330

(22) Filed: Mar. 26, 2001

(65) Prior Publication Data

US 2002/0134582 A1 Sep. 26, 2002

(51) Int. Cl.⁷ .................................................. H05K 3/34
(52) U.S. Cl. ............................ 29/840; 29/832; 29/837; 29/746; 29/852; 29/854; 29/855; 29/856; 427/96; 427/97; 427/98; 438/126; 438/613; 438/614
(58) Field of Search ........................... 29/832, 837, 846, 29/854, 855, 856, 840, 852; 438/126, 613, 614; 427/96, 97, 98

(56) References Cited

U.S. PATENT DOCUMENTS

| 4,821,151 | A | * | 4/1989 | Pryor et al. | ................. | 361/771 |
| 5,098,864 | A | * | 3/1992 | Mahulikar | ................... | 29/837 |
| 5,808,873 | A | * | 9/1998 | Celaya et al. | ............... | 361/760 |
| 5,895,229 | A | * | 4/1999 | Carney et al. | .............. | 438/106 |
| 6,046,499 | A | * | 4/2000 | Yano et al. | ................. | 257/712 |
| 6,162,664 | A | * | 12/2000 | Kim | ........................... | 438/126 |
| 6,262,477 | B1 | * | 7/2001 | Mahulikar et al. | .......... | 257/698 |

* cited by examiner

*Primary Examiner*—Carl J. Arbes
*Assistant Examiner*—Tim Phan
(74) *Attorney, Agent, or Firm*—James J. StiPanuk; Kevin B. Jackson

(57) ABSTRACT

An integrated circuit package (60) has a substrate (12) with a first surface (51) for mounting a semiconductor die (20) and a second surface (52) defining a via (70). A lead (26) is formed by plating a conductive material to project outwardly from the second surface. The conductive material extends from the lead through the first via for coupling to the semiconductor die.

16 Claims, 3 Drawing Sheets

METHOD OF MAKING A LEAD-FREE INTEGRATED CIRCUIT PACKAGE

BACKGROUND OF THE INVENTION

The present invention relates in general to semiconductor devices and, more particularly, to integrated circuits that include a grid array package for housing a semiconductor die.

Integrated circuits that have high pin or lead counts often are housed in grid array packages to achieve a small size. For example, ball grid array (BGA) packages are used to provide chip scale or nearly chip scale integrated circuits that have between eighty and three hundred leads. A BGA package includes an interposer or substrate whose top surface has a region for mounting a semiconductor die. Wire bonds electrically connect nodes of the semiconductor die to bonding pads formed on the top surface. Throughholes or vias through the substrate are used for connecting the bonding pads to access pads formed on the bottom surface of the substrate. The access pads typically are arranged in a grid to minimize the area occupied by the integrated circuit's leads. A solder mask is patterned with openings over each access pad to accommodate small solder balls which are reflowed to function leads of the BGA package.

Current BGA packages suffer from a high cost due to the complex equipment needed to pick up the small solder balls, place them on the access pads and then to reflow the solder without disturbing the solder ball positions. This equipment is expensive and occupies a large area of a manufacturing facility. The cost is further increased because the access pads must be made large enough to ensure that the solder mask openings do not overlap the boundaries of the access pads, thereby reducing the number of routing channels between access pads and increasing the size of the substrate. A further problem is the presence of lead in the solder balls, which is considered to be an environmental and health hazard.

Hence, there is a need for an integrated circuit grid array package and method which reduces the size and manufacturing cost of the package as well as the risk of environmental and health damage.

DETAILED DESCRIPTION OF THE DRAWINGS

In the figures, elements having the same reference numbers have similar functionality.

Figure 1:
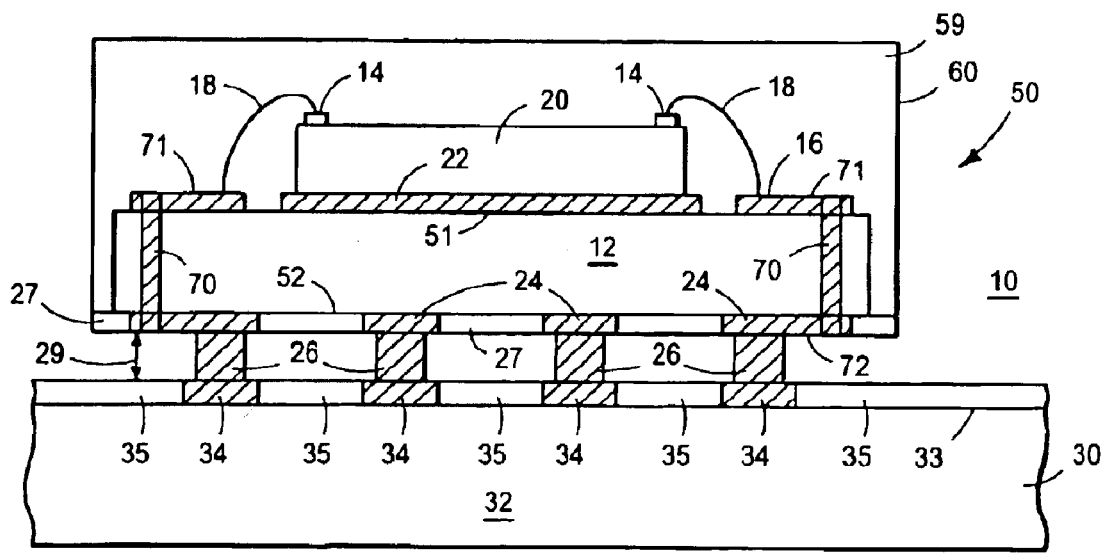
FIG. 1 is a cross-sectional view of an electrical system.

FIG. 1 is a cross-sectional view of an electrical system 10, including an integrated circuit 50 mounted to a motherboard 30. Integrated circuit 50 includes a semiconductor die 20 housed in an integrated circuit package 60.

Motherboard 30 comprises a standard printed circuit board consisting of a base 32 formed with glass epoxy or other dielectric material. Copper foil is laminated on a surface 33 of motherboard 30 and patterned to provide attachment pads 34 for securing leads 26 of package 60. Electrical and mechanical attachment of leads 26 is preferably accomplished with a lead-free solder which is reflowed after integrated circuit 50 is positioned on motherboard 30. Alternatively, a conductive material may be selectively plated on motherboard 30 to attach leads 26. A standard solder masking material is applied to surface 33 and patterned to form a solder mask 35 between attachment pads 34 to prevent a system malfunction due to solder bridging.

Package 60 comprises an interposer or substrate 12 formed with a dielectric material such as glass epoxy and/or bismaleimide-triazine (BT) resin. A copper foil formed to a typical thickness of about twenty-five micrometers is laminated on a first surface 51 of substrate 12 and patterned to form a die attach flag 22 as well as a plurality of bonding pads 16 and circuit interconnect traces 71. Die attach flag 22 is used for mounting semiconductor die 20 to substrate 12 with a thermally and/or electrically conductive epoxy or similar material. Bonding pads 16 are used for coupling electrical signals to die pads 14 of semiconductor die 20 with wire bonds 18. In an alternate embodiment, semiconductor die 12 may be mounted to substrate 12 in a flip-chip fashion. The foil laminated on surface 51 is described as comprising copper, but a suitable alternative conductive material may be used when appropriate. Package 60 includes a plastic molding compound 59 formed as shown to protect semiconductor die 20 from being damaged.

A copper foil formed to a thickness of about twenty-five micrometers is laminated on a surface 52 of substrate 12 and patterned to form a plurality of interconnect traces 72 and access pads 24. Integrated circuit 50 typically has between eighty and three hundred access pads 24 which are arrayed in a grid over surface 52 to minimize the area of package 60. Copper is plated on access pads 24 to project from surface 52 a typical distance of between fifty and one-hundred twenty five micrometers to form leads 26. Although the foil and leads 26 are described as comprising copper, another conductive material may be used in the alternative.

Openings are drilled in substrate 12 and copper plated to form vias 70 for coupling electrical signals between surface 51 and surface 52. A standard solder masking material is applied to surface 52 and patterned to form an insulating solder mask 27 as shown to provide damage protection and to prevent solder bridging when integrated circuit 50 is attached to motherboard 30.

Note that leads 26 are mounted to motherboard 30 so as to maintain a spacing 29 between surface 33 of motherboard 30 and surface 52 of substrate 12. Spacing 29 allows leads 26 to flex to absorb differences in the thermal expansion characteristics between motherboard 30 and integrated circuit 50. Such flexing improves the reliability of integrated circuit 50 by reducing the stress on semiconductor die 20. Flexing has an additional advantage of reducing shear stress where leads 26 and attachment pads 34 come into contact, thereby avoiding a circuit failure due to a detached lead. Similarly, flexing reduces the shear stress between leads 26 and access pads 24 to further improve reliability. As the length of leads 26 increases, the stress is reduced and reliability improves. Typically, leads 26 project from surface 52 a distance of between fifty and one hundred twenty-five micrometers to ensure that integrated circuit 50 has a low cost while meeting specified reliability levels.

Figure 2:
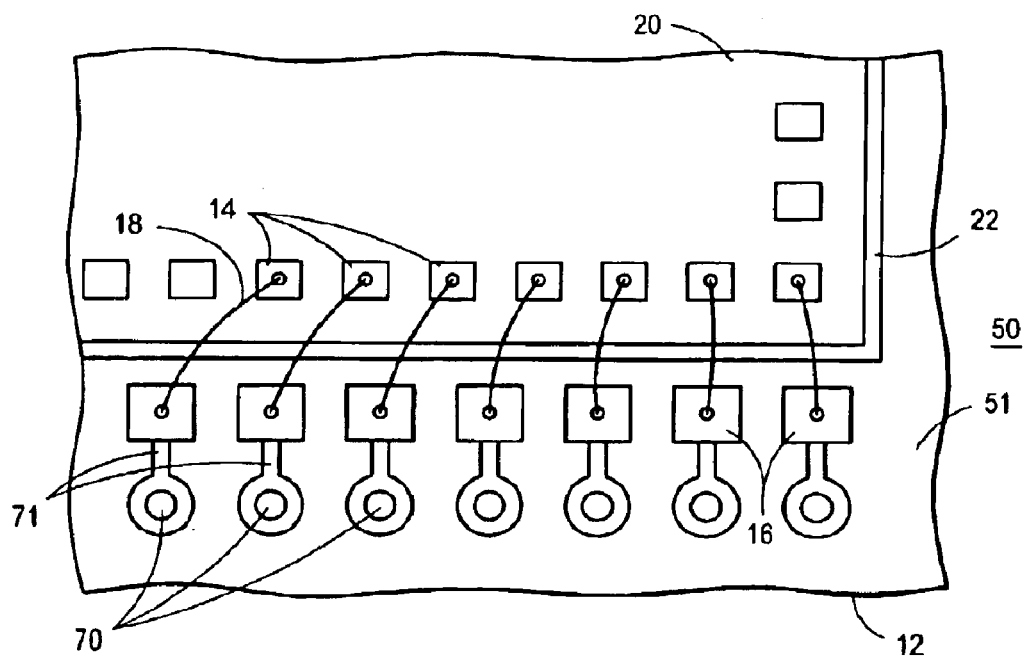
FIG. 2 is a top view of a first portion of an integrated circuit.

FIG. 2 is a top view of a first portion of integrated circuit 50, showing surface 51 of substrate 12 and semiconductor die 20 mounted on die attach flag 22. Die pads 14 typically are formed around the perimeter of semiconductor die 20 and coupled to bonding pads 16 with wire bonds 18 as shown. Substrate 12 is drilled to form throughholes or vias 70 whose sidewalls are copper plated to a thickness of about ten micrometers to provide electrical connections between surface 51 and surface 52 of substrate 12. Note that bonding pads 16 are formed to have a typical center-to-center spacing of about two hundred micrometers to facilitate wire bonding to die pads 14, which are formed with a typical center-to-center spacing of about one hundred fifty micrometers. The copper foil on surface 51 is further patterned to form traces 71 to extend bonding pads 16 to vias 70.

Figure 3:
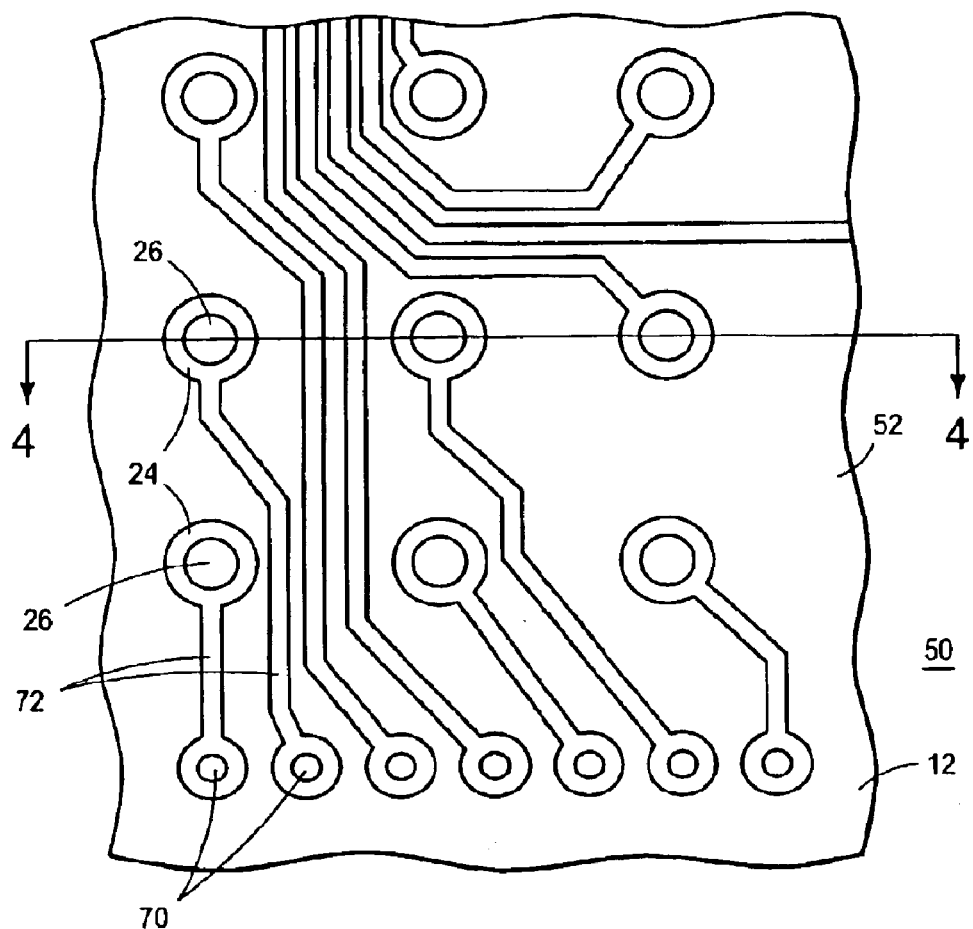
FIG. 3 is a bottom view of a second portion of the integrated circuit.

FIG. 3 is a bottom view of a second portion of integrated circuit 50, showing features formed on surface 52 in further detail. Vias 70 are extended through substrate 12 from surface 51. The copper foil laminated on surface 52 is patterned to form traces 72 which extend to provide signal paths from vias 70 to access pads 24 as shown. Leads 26 are formed by plating copper onto access pads 24 as described below.

Figure 4:
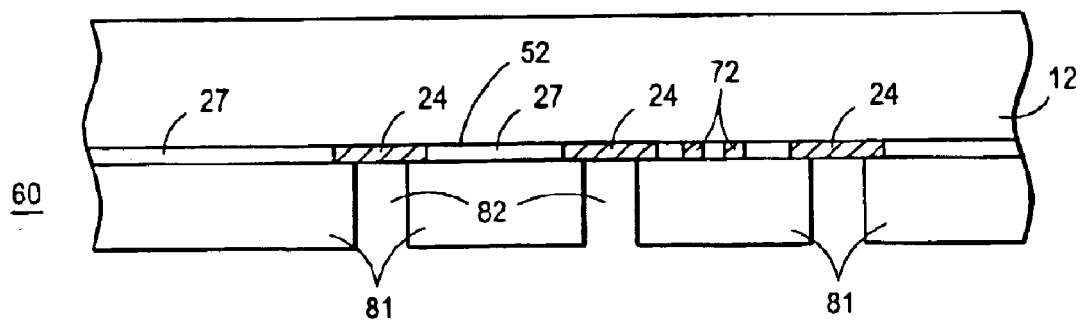
FIG. 4 is a cross-sectional view of a portion of an integrated circuit package after a first processing step.

FIG. 4 is a cross-sectional view of a portion of integrated circuit package 60 after a first processing step of the fabrication of leads 26. Substrate 12, access pads 24, traces 72 and solder mask 27 are formed as described above. A photoresist layer 81 is applied to cover surface 52 of substrate 12 and patterned to form openings 82 to expose access pads 24. Photoresist layer 81 is formed to a thickness determined by the desired height of leads 26. In one embodiment, photoresist layer 81 is formed to a thickness of about seventy five micrometers.

Figure 5:
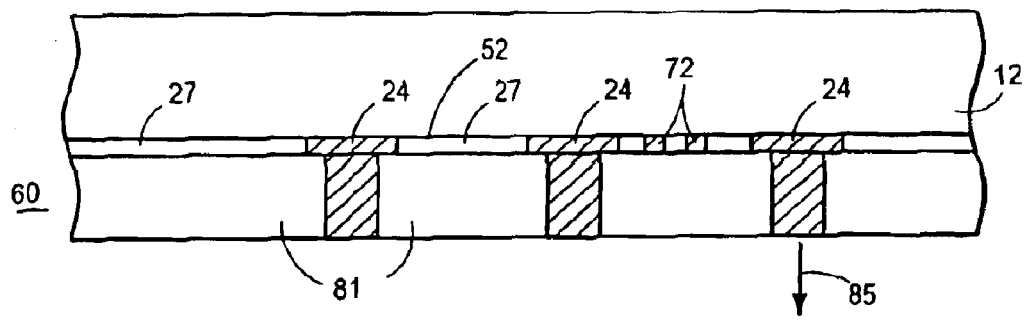
FIG. 5 is a cross-sectional view of the portion of the integrated circuit package after a second processing step.

FIG. 5 is a cross-sectional view of the portion of integrated circuit package 60 after a second processing step of the fabrication of leads 26. Package 60 is placed in a plating apparatus (not shown) to plate copper onto access pads 24 to fill openings 82 with plated copper. Copper is plated outwardly from surface 52 in a direction indicated by arrow 85. The plating step typically is a timed process whose duration is determined by the thickness of photoresist layer 81. In one embodiment, copper is electroplated in openings 82. In an alternative embodiment, electroless plating is used to deposit copper in openings 82. Although described as copper plating, a suitable alternate conductive material may be plated onto access pads 24.

Figure 6:
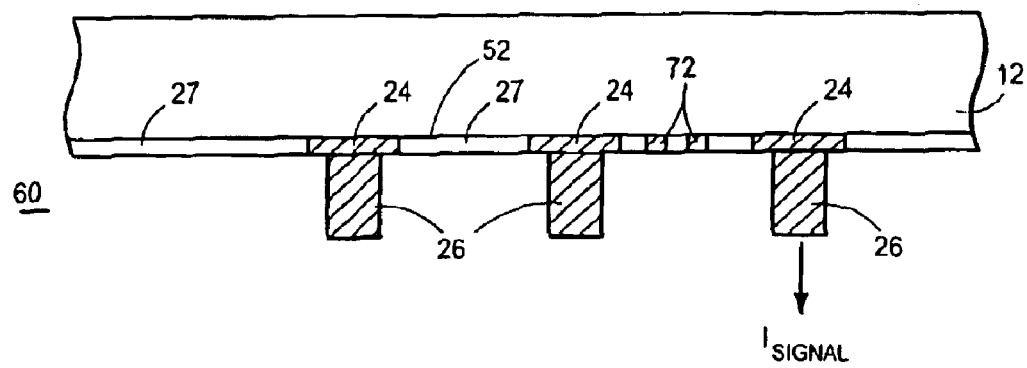
FIG. 6 is a cross-sectional view of the portion of the integrated circuit package after a third processing step.

FIG. 6 is a cross-sectional view of the portion of integrated circuit package 60 after a third processing step of the fabrication of leads 26. Photoresist layer 81 is removed using a standard removal process to leave leads 26 projecting outwardly from surface 52 as shown. In the described embodiment, leads 26 and access pads 24 are formed with the same conductive material, i.e., copper, so a secure mechanical interface as well as a low resistance connection between leads 26 and access pads 24 is obtained. In addition, plating produces a grain structure in leads 26 which results in a higher flexibility than would result from a more crystalline structure. The higher flexibility effectively provides a greater strain relief when motherboard 30 and package 60 expand at different rates as the temperature varies, which improves reliability. Moreover, plating provides a high degree of control over the height of leads 26, which results in a more uniform spacing between motherboard 30 and integrated circuit 50 than is achieved by using solder balls to form package leads. This uniformity improves reliability by ensuring that stress relief is more evenly distributed among leads 26 than is provided using solder ball leads.

Although access pads 24 are formed with copper foil while leads 26 are formed with plated copper, they have different structural characteristics. Plated copper is formed with grains which typically have a columnar structure whose grain boundaries run parallel to the direction of plating.

That is the columnar grains of leads 25 run outwardly from surface 52 and parallel to the plating direction indicated by arrow 85 of FIG. 5. Such a structure produces a high shear strength in leads 26. Moreover, a signal current $I_{SIGNAL}$ flowing through one of the leads 26 in the plating direction encounters fewer grain boundaries than a current flowing perpendicular to the plating direction. Therefore, $I_{SIGNAL}$ flows through a lower electrical resistance.

Although solder mask 27 is shown as being formed before photoresist layer 81 is deposited and patterned, solder mask 27 may alternatively be formed after leads 26 are plated and photoresist layer 81 is removed. In this embodiment, leads 26 are protected with a screen template to avoid coating and a standard liquid solder masking material is flowed on surface 52 between leads 26. Such a process has an advantage of avoiding the need to use photoresist process to form solder mask 27, thereby reducing the manufacturing cost of integrated circuit 50.

In summary, the above described integrated circuit, package and method provide a higher reliability and lower cost than is achieved with previous grid array packages and methods. A substrate has a first surface for mounting a semiconductor die and a second surface defining a first via. A lead is formed with a conductive material to project outwardly from the second surface, where the conductive material extends from the lead through the first via for coupling to the semiconductor die. The leads are formed with a plating process to improve their flexibility and better control their height, which results in a high reliability. In addition, the use of copper leads has a further advantage of a lower thermal resistance than packages using solder ball leads, which lowers the die temperature to further improve reliability. Moreover, the invention eliminates the need for lead-based or other types of solder balls to form the leads, thereby reducing the cost of the package and the risk of health or environmental damage.

What is claimed is:

1. A method of making an integrated circuit, comprising the step of plating a conductive material to project outwardly from a second surface of a substrate to form a lead-free first lead of the integrated circuit, wherein the lead-free first lead projects outwardly a distance from the second surface between about 50 microns to about 125 microns.

2. The method of claim 1, further comprising the step of mounting a semiconductor die to a first surface of the substrate.

3. The method of claim 2, further comprising the step of forming a signal path on the first surface with the conductive material.

4. The method of claim 3, further comprising the step of disposing the conductive material in a via defined by the substrate to extend the signal path from the first surface to the second surface of the substrate.

5. The method of claim 4, further comprising the step of disposing the conductive material on the second surface to extend the signal path from the via to the load-free first load.

6. The method of claim 3, further comprising the step of wire bonding the signal path to a node of the semiconductor die to couple a signal between the node and the lead-free first lead.

7. The method of claim 1, further comprising the step of forming an access pad on the second surface, wherein the access pad comprises the conductive material, and wherein the step of plating the conductive material includes plating the conductive material onto the access pad.

8. The method of claim 7 further comprising the steps of;

disposing a photoresist layer on the second surface;

patterning the photoresist layer to expose the access pad; and plating the conductive material on the access pad.

9. The method of claim 8, wherein the step of disposing the photoresist layer includes disposing a photoresist layer having a thickness determined by a desired height of the lead-free first lead.

10. The method of claim 1, wherein the step of plating includes the step of plating copper.

11. The method of claim 1, further comprising the step of forming a solder mask on the second surface between the lead-free first lead and a lead-free second lead of the integrated circuit.

12. The method of claim 11, wherein the step of forming includes the step of forming the solder mask after the step of plating.

13. The method of claim 1, wherein the step of plating includes the step of plating the conductive material in an outward direction for routing a current ($I_{SIGNAL}$) through the lead-free first lead that flows parallel to the outward direction.

14. A method of forming an integrated circuit, comprising the steps of:

providing a substrate having a first surface for mounting a semiconductor die; and plating a conductive material to extend outwardly from a second surface of the substrate to form a lead-free lead of the integrated circuit, wherein the lead-free lead extends outwardly from the second surface a distance between about 50 microns and about 125 microns.

15. The method of claim 14, wherein the step of plating includes plating copper to form the lead-free lead.

16. A method of making an integrated circuit, comprising the steps of:

mounting a semiconductor die to a first surface of a substrate;

disposing a conductive material along the first surface and through a via of the substrate to form a signal path of the integrated circuit between the first and a second surface of the substrate; and plating the conductive material on the second surface to form a lead-free lead of the integrated circuit that is electrically coupled to the signal path, and that projects outwardly from the second surface a distance between about microns and about 125 microns.

* * * * *

UNITED STATES PATENT AND TRADEMARK OFFICE
CERTIFICATE OF CORRECTION

PATENT NO. : 6,889,429 B2
DATED : May 10, 2005
INVENTOR(S) : Phillip C. Celaya et al.

It is certified that error appears in the above-identified patent and that said Letters Patent is hereby corrected as shown below:

Column 6,
Line 23, insert -- 50 -- after "about"

Signed and Sealed this

Twelfth Day of July, 2005

JON W. DUDAS
*Director of the United States Patent and Trademark Office*